(12) United States Patent
Ichi et al.

(10) Patent No.: US 12,366,836 B2
(45) Date of Patent: Jul. 22, 2025

(54) UPPER POWER MANAGEMENT DEVICE, POWER INTERCHANGE CONTROL METHOD, AND RECORDING MEDIUM

(71) Applicant: TDK Corporation, Tokyo (JP)

(72) Inventors: Masao Ichi, Tokyo (JP); Shingo Suzuki, Tokyo (JP); Takuma Mitsunaga, Tokyo (JP); Katsuo Naoi, Tokyo (JP); Hisakazu Uto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 528 days.

(21) Appl. No.: 17/968,271

(22) Filed: Oct. 18, 2022

(65) Prior Publication Data

US 2023/0333525 A1      Oct. 19, 2023

(30) Foreign Application Priority Data

Apr. 14, 2022   (JP) ................................ 2022-066828

(51) Int. Cl.
G05B 15/02     (2006.01)
G01R 21/06     (2006.01)
H02J 3/38      (2006.01)

(52) U.S. Cl.
CPC ............ *G05B 15/02* (2013.01); *G01R 21/06* (2013.01); *H02J 3/381* (2013.01); *H02J 2207/20* (2020.01); *H02J 2300/20* (2020.01)

(58) Field of Classification Search
CPC .. G05B 15/02; G01R 21/06; H02J 3/38; H02J 3/381; H02J 2207/20; H02J 2300/20
See application file for complete search history.

(56) References Cited

U.S. PATENT DOCUMENTS

2015/0263519 A1     9/2015   Suzuki

FOREIGN PATENT DOCUMENTS

JP           2015-177686 A      10/2015

*Primary Examiner* — Robert L Deberadinis
(74) *Attorney, Agent, or Firm* — Oliff PLC

(57) ABSTRACT

An upper power management device includes: an update unit that updates a target value of interest based on a received power value of electric power received by a first power feeding system that is making a power transmission request, and a transmitted power value of electric power transmitted by a second power feeding system that is responding to the power transmission request, the target value of interest including at least one of a power reception target value of an external bus voltage in a first converter of the first power feeding system, and a power transmission target value of the external bus voltage in a second converter of the second power feeding system; and an output unit that outputs a first setting command for setting the power reception target value in the first converter and a second setting command for setting the power transmission target value in the second converter.

6 Claims, 9 Drawing Sheets

UPPER POWER MANAGEMENT DEVICE, POWER INTERCHANGE CONTROL METHOD, AND RECORDING MEDIUM

CROSS-REFERENCE TO RELATED APPLICATION

This application is based on Japanese Patent Application No. 2022-066828 filed with Japan Patent Office on Apr. 14, 2022 and claims the benefit of priority thereto. The entire contents of the application are incorporated herein by reference.

TECHNICAL FIELD

The present disclosure relates to an upper power management device, a power interchange control method, and a recording medium.

BACKGROUND

There is known a power interchange system in which electric power is interchanged between power supply grids that supply electric power using distributed power supplies. For example, Japanese Unexamined Patent Application Publication No. 2015-177686 describes a power interchange system including a plurality of power transmission/reception units and a virtual power transmission network construction device connected to the plurality of power transmission/reception units via a communication network. In this power interchange system, the virtual power transmission network construction device drafts a power interchange plan between power transmission/reception units, and a power transmission/reception unit on the power transmission side transmits electric power specified in the power interchange plan to a specified path for a specified period.

SUMMARY

Power transmission loss occurs when power is transmitted between power transmission/reception units (power feeding systems). In the present technical field, it is desired to suppress power transmission loss to improve transmission efficiency.

The present disclosure describes an upper power management device, a power interchange control method, and a recording medium capable of improving power transmission efficiency.

An upper power management device according to one aspect of the present disclosure is a device that controls power interchange between a plurality of power feeding systems connected to each other via an external direct current (DC) bus. The upper power management device includes: an acquisition unit that acquires a received power value that is a measured value of electric power received by a first power feeding system, and a transmitted power value that is a measured value of electric power transmitted by a second power feeding system, the first power feeding system being a power feeding system that is making a power transmission request among the plurality of power feeding systems, the second power feeding system being a power feeding system that is responding to the power transmission request among the plurality of power feeding systems; an update unit that updates a target value of interest based on the received power value and the transmitted power value, the target value of interest including at least one of a power reception target value that is a target value of an external bus voltage supplied to the external DC bus in a first converter and a power transmission target value that is a target value of the external bus voltage in a second converter, the first converter being capable of bidirectionally converting between the external bus voltage and a first internal bus voltage supplied to a first internal DC bus that supplies DC electric power in the first power feeding system, the second converter being capable of bidirectionally converting between the external bus voltage and a second internal bus voltage supplied to a second internal DC bus that supplies DC electric power in the second power feeding system; and an output unit that outputs a first setting command for setting the power reception target value in the first converter and a second setting command for setting the power transmission target value in the second converter.

A power interchange control method according to another aspect of the present disclosure is a method for controlling power interchange between a plurality of power feeding systems connected to each other via an external DC bus. The power interchange control method includes: acquiring a received power value that is a measured value of electric power received by a first power feeding system, and a transmitted power value that is a measured value of electric power transmitted by a second power feeding system, the first power feeding system being a power feeding system that is making a power transmission request among the plurality of power feeding systems, the second power feeding system being a power feeding system that is responding to the power transmission request among the plurality of power feeding systems; updating a target value of interest based on the received power value and the transmitted power value, the target value of interest including at least one of a power reception target value that is a target value of an external bus voltage supplied to the external DC bus in a first converter and a power transmission target value that is a target value of the external bus voltage in a second converter, the first converter being capable of bidirectionally converting between the external bus voltage and a first internal bus voltage supplied to a first internal DC bus that supplies DC electric power in the first power feeding system, the second converter being capable of bidirectionally converting between the external bus voltage and a second internal bus voltage supplied to a second internal DC bus that supplies DC electric power in the second power feeding system; and outputting a first setting command for setting the power reception target value in the first converter and a second setting command for setting the power transmission target value in the second converter.

A recording medium according to still another aspect of the present disclosure is a non-transitory computer-readable recording medium recording a power interchange control program that causes a computer to operate so as to control power interchange between a plurality of power feeding systems connected to each other via an external DC bus. The power interchange control program configured to cause a computer to execute: acquiring a received power value that is a measured value of electric power received by a first power feeding system, and a transmitted power value that is a measured value of electric power transmitted by a second power feeding system, the first power feeding system being a power feeding system that is making a power transmission request among the plurality of power feeding systems, the second power feeding system being a power feeding system that is responding to the power transmission request among the plurality of power feeding systems; updating a target value of interest based on the received power value and the transmitted power value, the target value of interest including at least one of a power reception target value that is a target value of an external bus voltage supplied to the external DC bus in a first converter and a power transmission target value that is a target value of the external bus voltage in a second converter, the first converter being capable of bidirectionally converting between the external bus voltage and a first internal bus voltage supplied to a first internal DC bus that supplies DC electric power in the first power feeding system, the second converter being capable of bidirectionally converting between the external bus voltage and a second internal bus voltage supplied to a second internal DC bus that supplies DC electric power in the second power feeding system; and outputting a first setting command for setting the power reception target value in the first converter and a second setting command for setting the power transmission target value in the second converter.

In the upper power management device, the power interchange control method, and the recording medium, the target value of interest including at least one of the power reception target value of the external bus voltage in the first converter and the power transmission target value of the external bus voltage in the second converter is updated based on the received power value received by the first power feeding system making the power transmission request and the transmitted power value transmitted by the second power feeding system responding to the power transmission request. When electric power is transmitted from the second power feeding system to the first power feeding system via the external DC bus, the power reception target value of the external bus voltage in the first converter and the power transmission target value of the external bus voltage in the second converter may affect the power transmission efficiency. Since it can be said that the power transmission loss increases as the received power value becomes smaller than the transmitted power value, the target value of interest can be updated so as to suppress the power transmission loss by considering the received power value and the transmitted power value. As a result, the power transmission efficiency can be improved.

In some embodiments, the update unit may calculate a power transmission loss based on the received power value and the transmitted power value, and may update the target value of interest so as to reduce the power transmission loss. In this case, since the power transmission loss is reduced, the power transmission efficiency can be improved.

In some embodiments, the update unit may repeatedly update the target value of interest. The update unit may update the target value of interest by adding a predetermined value to the target value of interest while maintaining a sign of the predetermined value when the power transmission loss decreases compared to the power transmission loss in a previous update, and may update the target value of interest by inverting the sign of the predetermined value and adding the predetermined value having the inverted sign to the target value of interest when the power transmission loss increases compared to the power transmission loss in the previous update. According to this configuration, as long as the power transmission loss continues to decrease, the target value of interest is changed by the predetermined value in the same direction as the previous update. On the other hand, when the power transmission loss turns to increase, the target value of interest is changed by the predetermined value in the direction opposite to the previous update. Therefore, it is possible to search for an extreme value of the target value of interest in which the power transmission loss is minimum within the range of change of the target value of interest.

In some embodiments, the upper power management device may further include a response unit that responds to the power transmission request. The response unit may select, as the second power feeding system, a power feeding system that has transmitted a power transmission enabled response from among the plurality of power feeding systems. In this case, since the power feeding system capable of transmitting electric power is selected as the second power feeding system, it is possible to reduce the possibility that electric power shortage occurs in the plurality of power feeding systems as a whole.

According to each aspect and each embodiment of the present disclosure, power transmission efficiency can be improved.

DETAILED DESCRIPTION

Embodiments of the present disclosure will be described in detail with reference to the drawings. It should be noted that in the description of the drawings, the same elements are designated with the same reference signs, and the redundant description is omitted.

Figure 1:
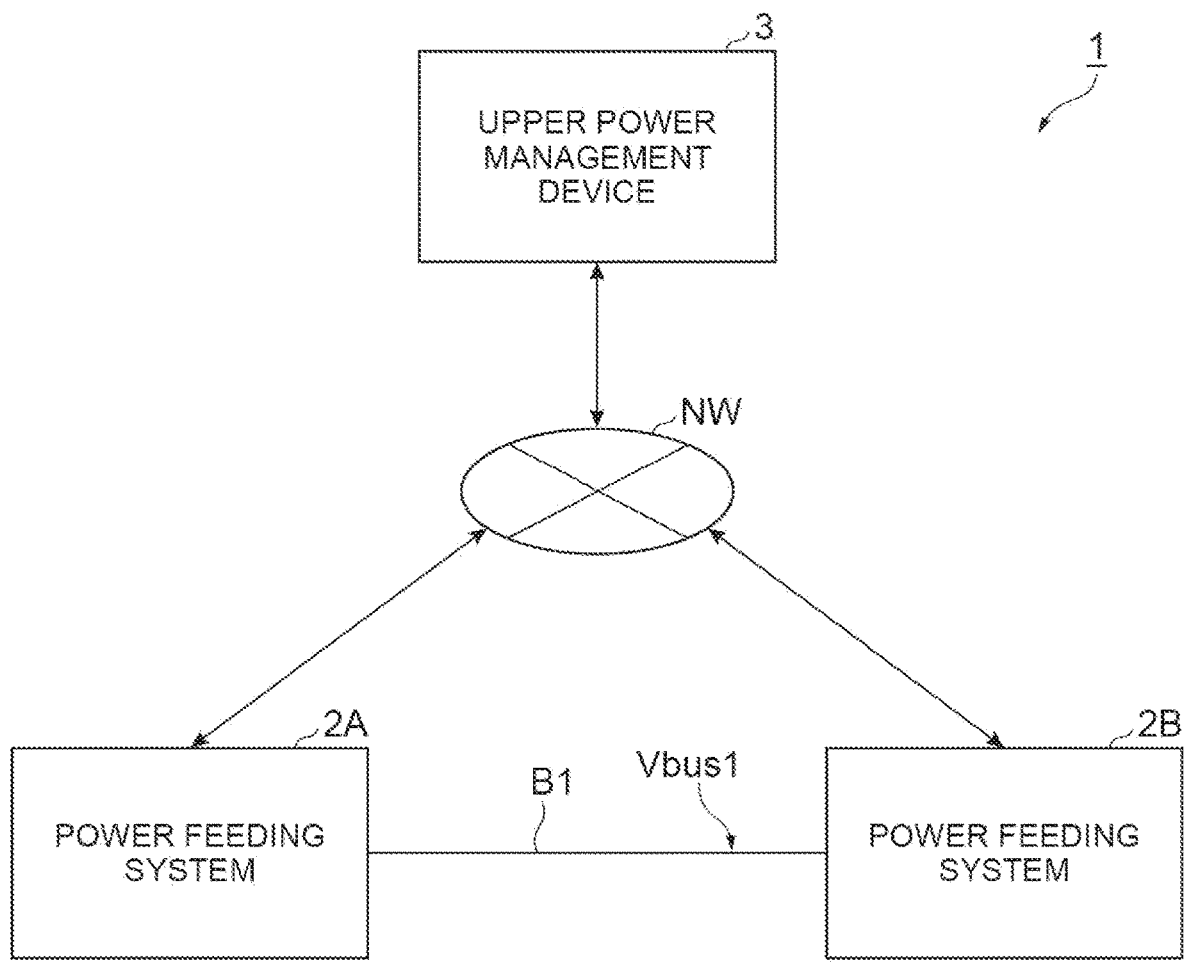
FIG. 1 is a configuration diagram schematically showing a power interchange system including an upper power management device according to an embodiment.

A power interchange system including an upper power management device according to an embodiment will be described with reference to FIG. 1. FIG. 1 is a configuration diagram schematically showing a power interchange system including an upper power management device according to an embodiment. A power interchange system 1 shown in FIG. 1 is a system for mutually supplying direct current (DC) electric power (power interchange) among a plurality of power feeding systems. Hereinafter, supplying DC electric power is referred to as "power transmission", receiving DC electric power is referred to as "power reception", and these are collectively referred to as "power transmission/reception" or "power interchange". The power interchange system 1 includes a plurality of power feeding systems, an upper power management device 3, and an external DC bus B1.

In the present embodiment, a configuration in which the power interchange system 1 includes two power feeding systems (a power feeding system 2A and a power feeding system 2B) is illustrated. The power feeding system 2A and the power feeding system 2B are connected to each other via the external DC bus B1. In this case, one of the power feeding system 2A and the power feeding system 2B supplies electric power to the other. For example, when the amount of electric power stored in the power feeding system 2A (the amount of stored electric power will be described later) is excessive and the amount of electric power stored in the power feeding system 2B is insufficient, the power feeding system 2A supplies electric power to the power feeding system 2B via the external DC bus B1. Details of the power feeding systems 2A and 2B will be described later.

The external DC bus B1 is a bus that functions as a bus line for supplying DC electric power between the power feeding system 2A and the power feeding system 2B. An external bus voltage Vbus1 is supplied to the external DC bus B1. The external bus voltage Vbus1 is a high DC voltage. The external bus voltage Vbus1 is, for example, a voltage of DC 350 V or more and DC 410 V or less. The voltage value of the external bus voltage Vbus1 is set by the power feeding system 2A or the power feeding system 2B.

The upper power management device 3 is a device for controlling power interchange between a plurality of power feeding systems (in the present embodiment, the power feeding system 2A and the power feeding system 2B). The upper power management device 3 is connected to the power feeding system 2A and the power feeding system 2B via a communication network NW so as to be able to communicate with each other. The communication network NW may be constituted by either wired or wireless. Examples of the communication network NW include the Internet, a Wide Area Network (WAN), and a mobile communication network. The upper power management device 3 may be constituted by one computer 100 (see FIG. 2). The upper power management device 3 may be constituted by a plurality of computers 100 such as cloud computing.

Figure 2:
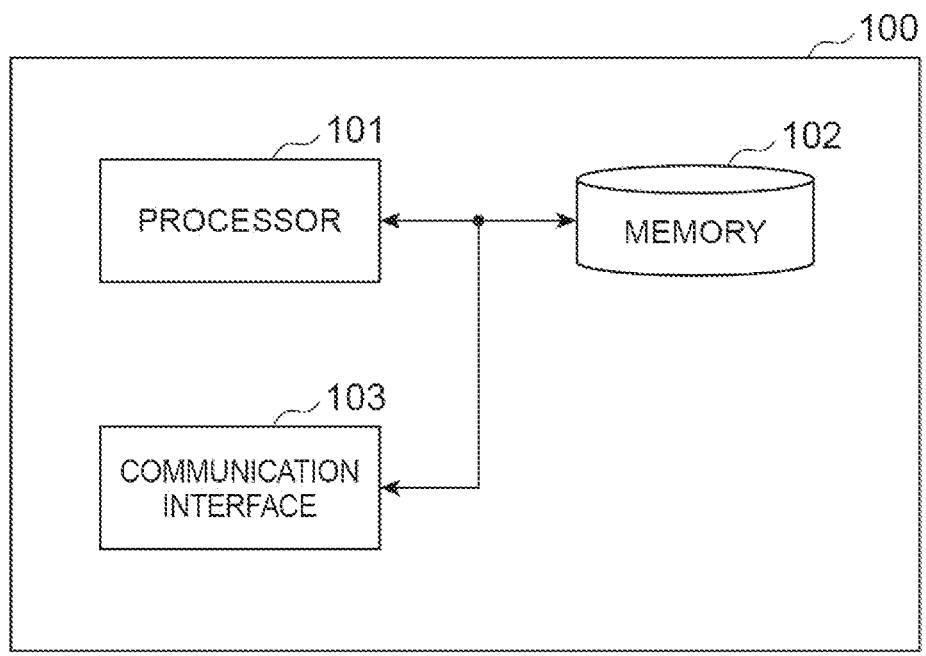
FIG. 2 is a hardware configuration diagram of a computer constituting the upper power management device shown in FIG. 1.

FIG. 2 is a hardware configuration diagram of a computer constituting the upper power management device shown in FIG. 1. As shown in FIG. 2, the computer 100 physically includes hardware such as a processor 101, a memory 102, and a communication interface 103.

An example of the processor 101 is a central processing unit (CPU). The memory 102 may include a main storage device and an auxiliary storage device. The main storage device is constituted by a random access memory (RAM), a read only memory (ROM), and the like. Examples of the auxiliary storage device include a semiconductor memory and a hard disk device. The communication interface 103 is a device that transmits/receives data to/from other devices. The communication interface 103 includes, for example, a communication module, a network interface card (NIC), or a wireless communication module conforming to a communication standard such as RS-232C, RS-485, or Controller Area Network (CAN).

Figure 4:
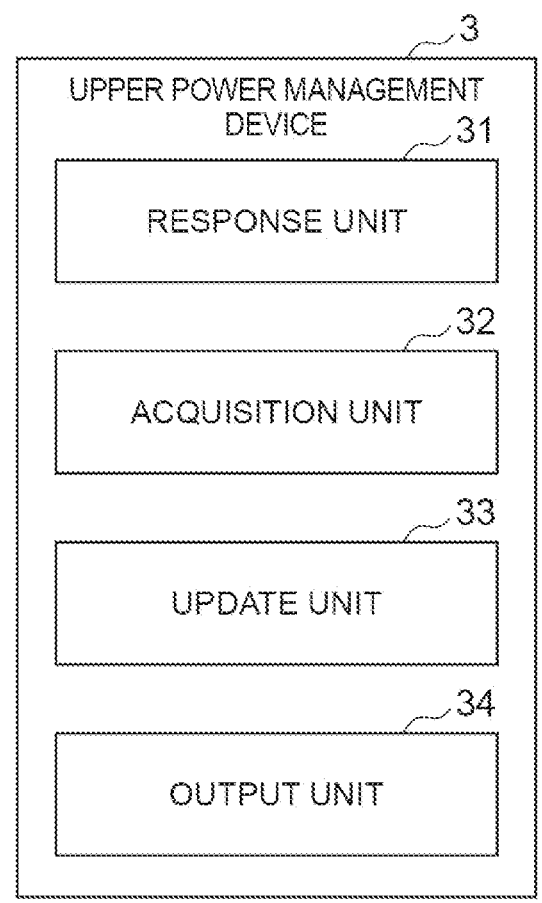
FIG. 4 is a functional block diagram of the upper power management device shown in FIG. 1.

By the processor 101 reading a power interchange control program PR (see FIG. 9) stored in the memory 102 to execute the program, each hardware operates under the control of the processor 101 to read and write data from/to the memory 102. Thus, each functional unit of the upper power management device 3 shown in FIG. 4 is implemented.

Figure 3:
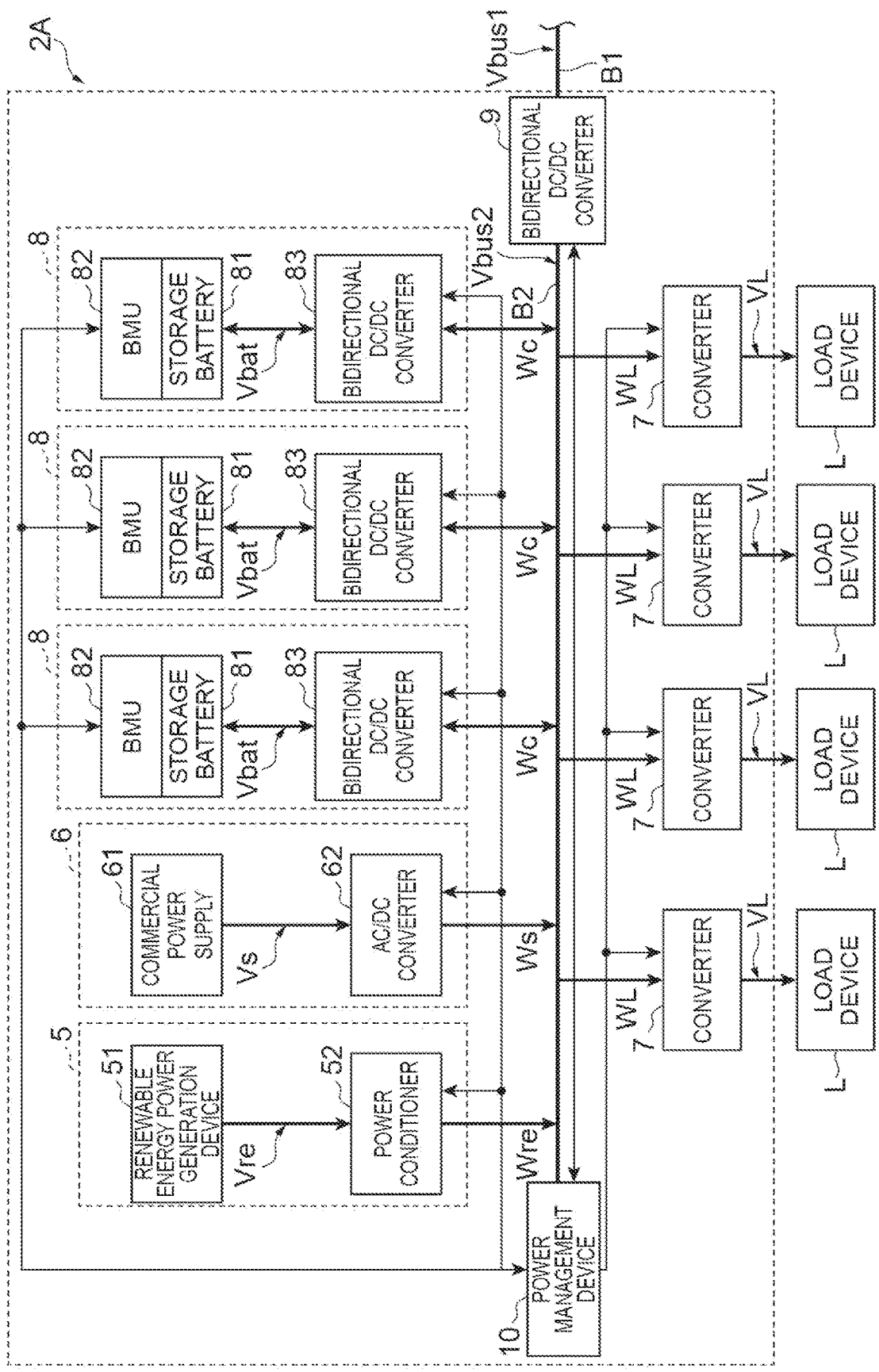
FIG. 3 is a configuration diagram schematically showing the power feeding system shown in FIG. 1.

Next, the power feeding systems 2A and 2B will be described with reference to FIG. 3. FIG. 3 is a configuration diagram schematically showing the power feeding system shown in FIG. 1. Since the power feeding system 2B has the configuration similar to that of the power feeding system 2A, only the power feeding system 2A will be described here. As shown in FIG. 3, the power feeding system 2A is a system that supplies load power WL (load voltage VL) to load devices L. In the present embodiment, the power feeding system 2A is a DC power feeding system. The load device L may be a DC load device that operates with a DC voltage or an alternating current (AC) load device that operates with an AC voltage. Examples of DC load devices include a light emission diode (LED) illuminators, DC fans, televisions, and personal computers. Examples of AC load devices include washing machines, refrigerators, and air conditioners. The power feeding system 2A and the power feeding system 2B supply electric power to each other (perform power interchange) via the external DC bus B1.

The power feeding system 2A includes a power supply device 5, an auxiliary power supply device 6, converters 7, power storage devices 8, a bidirectional DC/DC converter 9, a power management device 10, and an internal DC bus B2 (first internal DC bus, second internal DC bus).

The internal DC bus B2 is a bus that functions as a bus line for performing DC power supply for supplying DC electric power within the power feeding system 2A. The internal DC bus B2 is laid across the installation locations of the power supply device 5, the auxiliary power supply device 6, the converters 7, and the power storage devices 8. An internal bus voltage Vbus2 (first internal bus voltage, second internal bus voltage) is supplied to the internal DC bus B2. The internal bus voltage Vbus2 is a high DC voltage. The internal bus voltage Vbus2 is set to be included in the range of the input voltage of the converter 7. The internal bus voltage Vbus2 is, for example, a voltage equal to or higher than DC 240 V and equal to or lower than DC 300 V. The value of the internal bus voltage Vbus2 may be fixed or variable. It should be noted that the values of the external bus voltage Vbus1 and the internal bus voltage Vbus2 are not limited to those described above. The value of the external bus voltage Vbus1 may be the same as the value of the internal bus voltage Vbus2, or the value of the internal bus voltage Vbus2 may be larger than the value of the external bus voltage Vbus1.

The power supply device 5 is a device that supplies electric power to the internal DC bus B2. In the present embodiment, the power feeding system 2A includes one power supply device 5. The number of power supply devices 5 is not limited to one, and may be appropriately changed as necessary. The power supply device 5 includes a renewable energy power generation device 51 and a power conditioner 52.

The renewable energy power generation device 51 is a device that generates generated power Wre. Examples of the renewable energy power generation device 51 include a photovoltaic power generation device, a wind power generation device, a hydroelectric power generation device, and a geothermal power generation device. The renewable energy power generation device 51 is connected to the internal DC bus B2 via the power conditioner 52. The renewable energy power generation device 51 generates a power generation voltage Vre having a predetermined voltage value, and outputs the generated power Wre corresponding to the power generation voltage Vre. The power generation voltage Vre may be a DC voltage or an AC voltage.

The power conditioner 52 is connected to the internal DC bus B2, and is a device that converts the power generation voltage Vre into the internal bus voltage Vbus2. The power conditioner 52 is provided between the renewable energy power generation device 51 and the internal DC bus B2. When the power generation voltage Vre is a DC voltage, the power conditioner 52 includes a DC/DC converter. When the power generation voltage Vre is an AC voltage, the power conditioner 52 includes an AC/DC converter. The power conditioner 52 operates with, for example, a DC voltage internally generated based on the internal bus voltage Vbus2. The power conditioner 52 controls the generated power Wre by controlling the power generation operation of the renewable energy power generation device 51 based on a command from the power management device 10.

When the power conditioner 52 receives a start command from the power management device 10, the power conditioner 52 converts the power generation voltage Vre into the internal bus voltage Vbus2 and supplies the internal bus voltage Vbus2 to the internal DC bus B2, thereby supplying the generated power Wre to the internal DC bus B2.

When the power conditioner 52 receives a stop command from the power management device 10, the power conditioner 52 stops supplying the generated power Wre.

The power conditioner 52 has a power measurement function of measuring the generated power Wre supplied from the renewable energy power generation device 51 to the internal DC bus B2. The power conditioner 52 periodically measures the generated power Wre, for example. The power conditioner 52 transmits the measured value of the generated power Wre to the power management device 10.

The auxiliary power supply device 6 is a device that supplies electric power to the internal DC bus B2. The auxiliary power supply device 6 includes a commercial power supply 61 and an AC/DC converter 62. The commercial power supply 61 supplies system power Ws including a system voltage Vs. The system voltage Vs is an AC voltage. The commercial power supply 61 is connected to the internal DC bus B2 via the AC/DC converter 62.

The AC/DC converter 62 is connected to the internal DC bus B2, and is a device that converts the system voltage Vs into the internal bus voltage Vbus2. The AC/DC converter 62 is provided between the commercial power supply 61 and the internal DC bus B2. The AC/DC converter 62 operates with, for example, a DC voltage internally generated based on the system voltage Vs. When the AC/DC converter 62 receives a start command from the power management device 10, the AC/DC converter 62 converts the system voltage Vs into the internal bus voltage Vbus2 and supplies the internal bus voltage Vbus2 to the internal DC bus B2, thereby supplying the system power Ws to the internal DC bus B2. When the AC/DC converter 62 receives a stop command from the power management device 10, the AC/DC converter 62 stops supplying the system power Ws.

The AC/DC converter 62 has a power measurement function of measuring the system power Ws supplied from the commercial power supply 61 to the internal DC bus B2. The AC/DC converter 62 periodically measures the system power Ws, for example. The AC/DC converter 62 transmits the measured value of the system power Ws to the power management device 10.

Since the auxiliary power supply device 6 can stably supply electric power, the auxiliary power supply device 6 is controlled so as to supply electric power when the electric power of the entire power feeding system 2A is insufficient. In order to maintain the power feeding system 2A, the system power Ws is equal to or greater than the sum of the total load power WL and the standby power in the power feeding system 2A. The standby power includes power consumption of the power management device 10 and power consumption of auxiliary devices (relays, fans, and small-capacity power supplies, not shown).

The converter 7 is connected to the internal DC bus B2, and is a device that converts the internal bus voltage Vbus2 into a load voltage VL. The load voltage VL is a voltage supplied to the load device L. The load device L is connected to the internal DC bus B2 via the converter 7. The converter 7 operates with, for example, a DC voltage internally generated based on the internal bus voltage Vbus2. In the present embodiment, the power feeding system 2A includes four converters 7. The number of converters 7 is not limited to four, and may be changed in accordance with the number of load devices L.

When the converter 7 receives a start command from the power management device 10, the converter 7 converts the internal bus voltage Vbus2 into the load voltage VL, and supplies the load voltage VL (load power WL) to the load device L. When the load device L is a DC load device, the load voltage VL is a DC voltage, and the converter 7 is a DC/DC converter. For example, the converter 7 converts the internal bus voltage Vbus2 of DC 270 V into the load voltage VL of DC 24 V. When the load device L is an AC load device, the load voltage VL is an AC voltage, and the converter 7 is a DC/AC converter. When the converter 7 receives a stop command from the power management device 10, the converter 7 stops supplying the load voltage VL (load power WL).

The converter 7 has a current limiting function of limiting a current value of a load current supplied from the internal DC bus B2 to the load device L to an upper limit current value. The upper limit current value is set by the power management device 10. The converter 7 has a power measurement function of measuring the load power WL supplied from the internal DC bus B2 to the load device L based on the load voltage VL and the load current. The converter 7 periodically measures the load power WL, for example. The converter 7 transmits the measured value of the load power WL to the power management device 10.

The power storage device 8 is a device for storing surplus electric power that occurs in the power feeding system 2A and supplying deficient electric power that occurs in the power feeding system 2A. When the difference power obtained by subtracting the sum of the load power WL from the sum of the supply power is larger than 0, surplus electric power equal to the magnitude (power value) of the difference power occurs. The supply power is electric power supplied to the internal DC bus B2. In the present embodiment, the supply power is the generated power Wre, and the system power Ws. To each power storage device 8, for example, power Wc obtained by equally dividing surplus electric power by the number of power storage devices 8 is supplied from the internal DC bus B2. When the difference power is less than 0, deficient electric power equal to the magnitude of the difference power occurs. From each power storage device 8, for example, power Wc obtained by equally dividing the deficient electric power by the number of power storage devices 8 is released to the internal DC bus B2.

The number of power storage devices 8 is not limited to three, and may be appropriately changed as necessary. Each of the power storage devices 8 includes a storage battery 81, a battery management unit (BMU) 82, and a bidirectional DC/DC converter 83.

The storage battery 81 is a chargeable and dischargeable device. The storage battery 81 is connected to the internal DC bus B2 via the bidirectional DC/DC converter 83. Examples of the storage battery 81 include a lithium ion battery, a sodium-sulfur (NAS) battery, a redox flow battery, a lead acid battery, and a nickel metal hydride battery. In the present embodiment, the storage batteries 81 included in the power storage devices 8 are of the same type and have the same storage capacity. The storage capacity is the maximum amount of electric power that can be stored. The storage batteries 81 included in the power storage devices 8 may be different types of storage batteries and may have different storage capacities. The storage battery 81 includes, for example, a plurality of battery cells.

The BMU 82 is a device that manages the storage battery 81. The BMU 82 has a function of measuring a battery voltage Vbat of the storage battery 81, and a function of calculating a state of charge (SOC) by measuring the current value of the charging and discharging current of the storage battery 81. The BMU 82 may further have a function of measuring cell voltages of the battery cells constituting the storage battery 81. The BMU 82 transmits the battery information of the storage battery 81 to the power management device 10. The battery information includes, for example, the measured value of the battery voltage Vbat, the current value of the charging and discharging current, the temperature of the storage battery 81, the storage capacity of the battery 81, and the SOC. The BMU 82 periodically transmits the battery information to the power management device 10.

The bidirectional DC/DC converter 83 is connected to the internal DC bus B2, and is a device capable of bidirectionally converting between the internal bus voltage Vbus2 and the battery voltage Vbat. The bidirectional DC/DC converter 83 is provided between the storage battery 81 and the internal DC bus B2. The battery voltage Vbat is the voltage of the storage battery 81. As the bidirectional DC/DC converter 83, a known bidirectional DC/DC converter can be used. The bidirectional DC/DC converter 83 operates with, for example, a DC voltage internally generated based on the internal bus voltage Vbus2.

The bidirectional DC/DC converter 83 is controlled by the power management device 10. Specifically, when the bidirectional DC/DC converter 83 receives a charge command from the power management device 10, the bidirectional DC/DC converter 83 converts the internal bus voltage Vbus2 into the battery voltage Vbat and causes a charging current to flow from the internal DC bus B2 to the storage battery 81. Thus, the storage battery 81 is charged. When the bidirectional DC/DC converter 83 receives a discharge command from the power management device 10, the bidirectional DC/DC converter 83 converts the battery voltage Vbat into the internal bus voltage Vbus2 and causes a discharging current to flow from the storage battery 81 to the internal DC bus B2. Thus, the storage battery 81 is discharged. The bidirectional DC/DC converter 83 may charge or discharge the storage battery 81 in a constant-current manner or in a constant-voltage manner.

When the bidirectional DC/DC converter 83 receives a stop command from the power management device 10, the bidirectional DC/DC converter 83 stops the operation and shifts to a sleep state in which the electric power consumption is reduced. When the bidirectional DC/DC converter 83 receives the charge command or the discharge command in the sleep state, the bidirectional DC/DC converter 83 exits from the sleep state and executes the charge process or the discharge process. The bidirectional DC/DC converter 83 has a current limiting function of limiting each current value of the charging current supplied to the storage battery 81 and the discharging current discharged from the storage battery 81 to a maximum current value or less. The bidirectional DC/DC converter 83 receives a setting command for the maximum current value from the power management device 10, the bidirectional DC/DC converter 83 sets the maximum current values of the charging current and discharging current to the maximum current value specified by the setting command.

When the bidirectional DC/DC converter 83 receives a setting command for a target value of the internal bus voltage Vbus2 from the power management device 10, the bidirectional DC/DC converter 83 sets the target value of the internal bus voltage Vbus2 to the target value specified by the setting command. The target value is a voltage value for making the voltage value of the internal bus voltage Vbus2 constant. The bidirectional DC/DC converter 83 has a function of maintaining the voltage value of the internal bus voltage Vbus2 at the target value even when the power Wc is changed.

The bidirectional DC/DC converter 83 has a power measurement function of measuring the power Wc. The bidirectional DC/DC converter 83 periodically measures the power Wc, for example. The bidirectional DC/DC converter 83 transmits the measured value of the power Wc to the power management device 10.

The bidirectional DC/DC converter 9 is provided between the external DC bus B1 and the internal DC bus B2, and is a device capable of bidirectionally converting between the external bus voltage Vbus1 and the internal bus voltage Vbus2. As the bidirectional DC/DC converter 9, a known bidirectional DC/DC converter can be used. The bidirectional DC/DC converter 9 operates with, for example, a DC voltage internally generated based on the internal bus voltage Vbus2.

The bidirectional DC/DC converter 9 is controlled by the power management device 10. When the bidirectional DC/DC converter 9 receives a setting command for a target value of the external bus voltage Vbus1 from the power management device 10, the bidirectional DC/DC converter 9 sets the target value of the external bus voltage Vbus1 to the target value specified by the setting command. The target value is a voltage value for making the voltage value of the external bus voltage Vbus1 constant.

When the bidirectional DC/DC converter 9 receives a stop command from the power management device 10, the bidirectional DC/DC converter 9 stops the operation and shifts to a sleep state in which the electric power consumption is reduced. When the bidirectional DC/DC converter 9 receives the setting command for the target value of the external bus voltage Vbus1 in the sleep state, the bidirectional DC/DC converter 9 exits from the sleep state and executes the power transmission/reception process.

The bidirectional DC/DC converter 9 has a power measurement function of measuring electric power input/output between the bidirectional DC/DC converter 9 and the external DC bus B1. The bidirectional DC/DC converter 9 periodically measures the electric power, for example. The bidirectional DC/DC converter 9 transmits the measured value of the electric power to the power management device 10.

The power management device 10 is a device (controller) that manages the entire power feeding system 2A. The power management device 10 is also referred to as an energy management system (EMS). The power management device 10 is connected to the power supply device 5, the auxiliary power supply device 6, the converters 7, the power storage devices 8, and the bidirectional DC/DC converter 9 via a communication line so as to be able to communicate with each other. The communication line may be configured to be wired or wireless. The power management device 10 is connected to the upper power management device 3 via the communication network NW so as to be able to communicate with each other. The power management device may perform communication conforming to standards such as RS-232C, RS-485, CAN, Ethernet (registered trademark), and Wi-Fi (registered trademark).

The power management device 10 has a hardware configuration similar to that of the upper power management device 3. In other words, like the upper power management device 3, the power management device 10 may be constituted by one computer 100 (see FIG. 2), or may be constituted by a plurality of computers 100 as in cloud computing.

The power management device 10 transmits a start command and a stop command to each of the power conditioner 52, the AC/DC converter 62, the converters 7, the bidirectional DC/DC converters 83, and the bidirectional DC/DC converter 9. For example, the power management device 10 causes the converter 7 to supply the load voltage VL by transmitting the start command to the converter 7. The power management device 10 causes the converter 7 to stop supplying the load voltage VL by transmitting the stop command to the converter 7. The same applies to the other converters.

The power management device 10 performs a charge and discharge process of charging and discharging the storage battery 81 by controlling the bidirectional DC/DC converter 83. The power management device 10 performs the charge and discharge process depending on the difference power. When the sum of the supply power is larger than the sum of the load power WL (when the difference power is larger than 0), the power management device 10 transmits the charge command to the bidirectional DC/DC converter 83 and causes the storage battery 81 to store surplus electric power that is the difference power. In each storage battery 81, for example, electric power obtained by equally dividing the surplus electric power by the number of storage batteries 81 is stored. When the sum of the supply power is smaller than the sum of the load power WL (when the difference power is smaller than 0), the power management device 10 transmits the discharge command to the bidirectional DC/DC converter 83 and causes the storage battery 81 to discharge the deficient electric power. For example, electric power obtained by equally dividing the deficient electric power by the number of storage batteries 81 is discharged from each storage battery 81.

The power management device 10 transmits a power transmission request, a stop request, a power transmission enabled response, and a power transmission disabled response to the upper power management device 3 based on the amount of electric power stored in the power feeding system 2A. The power transmission request is a request for receiving electric power from another power feeding system (power feeding system 2B in the present embodiment). The stop request is a request for stopping power interchange. The power transmission enabled response is a response for notifying the source of the power transmission request that electric power can be transmitted. The power transmission disabled response is a response for notifying the source of the power transmission request that no electric power can be transmitted.

The power management device 10 acquires, for example, the amount of electric power stored in the power feeding system 2A as follows. The power management device 10 receives the battery information from each BMU 82 and calculates the SOC of the entire power feeding system 2A based on the SOC and the storage capacity included in the battery information. For example, the power management device 10 calculates the amount of electric power stored in each storage battery 81 from the SOC and the storage capacity of each storage battery 81, and calculates the SOC of the entire power feeding system 2A by dividing the total amount of electric power stored in all storage batteries 81 by the sum of the storage capacities of all storage batteries 81. Then, the power management device 10 acquires the SOC of the entire power feeding system 2A as the amount of electric power stored in the power feeding system 2A. The power management device 10 may acquire the minimum amount of stored electric power (SOC) among the amounts of stored electric power of all the storage batteries 81 as the amount of electric power stored in the power feeding system 2A.

The power management device 10 transmits the power transmission request to the upper power management device 3 when the amount of electric power stored in the power feeding system 2A is insufficient. For example, when the amount of electric power stored in the power feeding system 2A is lower than a storage threshold value Bth1, the power management device 10 determines that the amount of electric power stored in the power feeding system 2A is insufficient, and transmits the power transmission request to the upper power management device 3. The storage threshold value Bth1 is a threshold value for determining that the amount of electric power stored in the power feeding system 2A is insufficient and that electric power needs to be received from another power feeding system (the power feeding system 2B in the present embodiment). The storage threshold value Bth1 is represented by, for example, SOC. The storage threshold value Bth1 is set to, for example, 20%.

When the power management device 10 receives the power transmission request from the upper power management device 3, the power management device 10 determines whether power transmission is possible or impossible based on the amount of electric power stored in the power feeding system 2A. For example, when the amount of electric power stored in the power feeding system 2A exceeds a storage threshold value Bth2, the power management device 10 determines that electric power can be transmitted, and transmits the power transmission enabled response to the upper power management device 3. The storage threshold value Bth2 is a threshold value for determining that the amount of electric power stored in the power feeding system 2A is excessive and that electric power can be transmitted to another power feeding system (the power feeding system 2B in the present embodiment). The storage threshold value Bth2 is larger than the storage threshold value Bth1. The storage threshold value Bth2 is represented by, for example, SOC. The storage threshold value Bth2 is set to, for example, 70%. On the other hand, the power management device 10 determines that electric power cannot be transmitted when the amount of electric power stored in the power feeding system 2A is equal to or less than the storage threshold value Bth2, for example, and transmits the power transmission disabled response to the upper power management device 3.

When the power feeding system 2A is receiving electric power from another power feeding system (the power feeding system 2B in the present embodiment), the power management device 10 transmits the stop request to the upper power management device 3 in response to the amount of electric power stored in the power feeding system 2A becoming sufficient. For example, when the amount of electric power stored in the power feeding system 2A exceeds a storage threshold value Bth3, the power management device 10 determines that the amount of electric power stored in the power feeding system 2A is sufficient and transmits the stop request to the upper power management device 3. The storage threshold value Bth3 is a threshold value for determining that the amount of electric power stored in the power feeding system 2A has been sufficient. The storage threshold value Bth3 is larger than the storage threshold value Bth1 and smaller than the storage threshold value Bth2. The storage threshold value Bth3 is represented by, for example, SOC. The storage threshold value Bth3 is set to 50%, for example.

When the power feeding system 2A is transmitting electric power to another power feeding system (in the present embodiment, the power feeding system 2B), the power management device 10 transmits the stop request to the upper power management device 3 in response to a decrease in the amount of electric power stored in the power feeding system 2A. For example, when the amount of electric power stored in the power feeding system 2A is lower than a storage threshold value Bth4, the power management device 10 determines that the amount of electric power stored in the power feeding system 2A decreased and transmits the stop request to the upper power management device 3. The storage threshold value Bth4 is a threshold value for determining that the amount of electric power stored in the power feeding system 2A decreases and no more electric power can be transmitted to another power feeding system (in the present embodiment, the power feeding system 2B). The storage threshold value Bth4 is larger than the storage threshold value Bth1 and smaller than the storage threshold value Bth2. The storage threshold value Bth4 may be the same value as or different from the storage threshold value Bth3. The storage threshold value Bth4 is represented by, for example, SOC. The storage threshold value Bth4 is set to 50%, for example.

Next, the functional configuration of the upper power management device 3 will be described with reference to FIG. 4. FIG. 4 is a functional block diagram of the upper power management device shown in FIG. 1. As shown in FIG. 4, the upper power management device 3 functionally includes a response unit 31, an acquisition unit 32, an update unit 33, and an output unit 34.

The response unit 31 is a functional unit that responds to a power transmission request. When the response unit 31 receives a power transmission request from one power feeding system, the response unit 31 transmits the power transmission request to other power feeding systems. The response unit 31 selects a power feeding system that has transmitted the power transmission enabled response as a response to the power transmission request as the power feeding system capable of transmitting electric power. When the response unit 31 receives the power transmission disabled response as a response to the power transmission request from all power feeding systems other than the power feeding system that is making the power transmission request, the response unit 31 transmits the power transmission disabled response to the power feeding system that is making the power transmission request.

The acquisition unit 32 is a functional unit that acquires a transmitted power value and a received power value. The transmitted power value is a measured value of electric power transmitted by the power feeding system responding to the power transmission request. More specifically, the transmitted power value is a measured value of electric power transmitted from the bidirectional DC/DC converter 9 to the external DC bus B1. The received power value is a measured value of electric power received by the power feeding system that is making the power transmission request. More specifically, the received power value is a measured value of electric power received by the bidirectional DC/DC converter 9 via the external DC bus B1.

The update unit 33 is a functional unit that updates a target value of interest based on the transmitted power value and the received power value. The target value of interest is a target value to be updated and includes at least one of a power transmission target value and a power reception target value. The power transmission target value is a target value of the external bus voltage Vbus1 in the bidirectional DC/DC converter 9 of the power feeding system that is responding to the power transmission request. The power reception target value is a target value of the external bus voltage Vbus1 in the bidirectional DC/DC converter 9 of the power feeding system that is making the power transmission request. The update unit 33 calculates a power transmission loss based on the transmitted power value and the received power value, and updates the target value of interest based on the power transmission loss.

The output unit 34 is a functional unit that outputs a setting command for setting a power transmission target value to the bidirectional DC/DC converter 9 of the power feeding system responding to the power transmission request, and a setting command for setting a power reception target value to the bidirectional DC/DC converter 9 of the power feeding system making the power transmission request. The output unit 34 outputs (transmits) the setting commands to the power management device 10 of each power feeding system.

Figure 5:
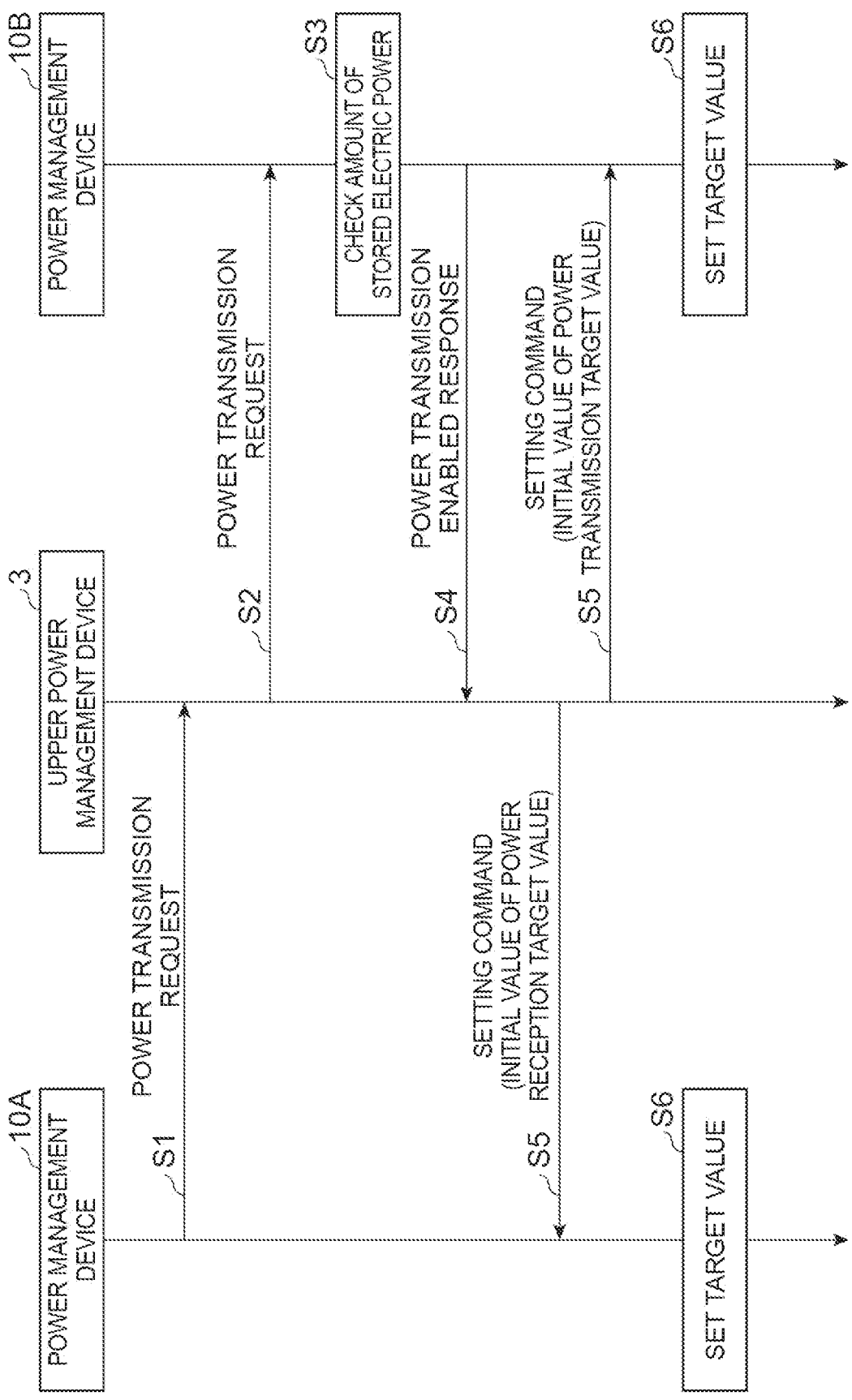
FIG. 5 is a sequence diagram showing a series of operations of the power interchange system shown in FIG. 1.
Figure 6:
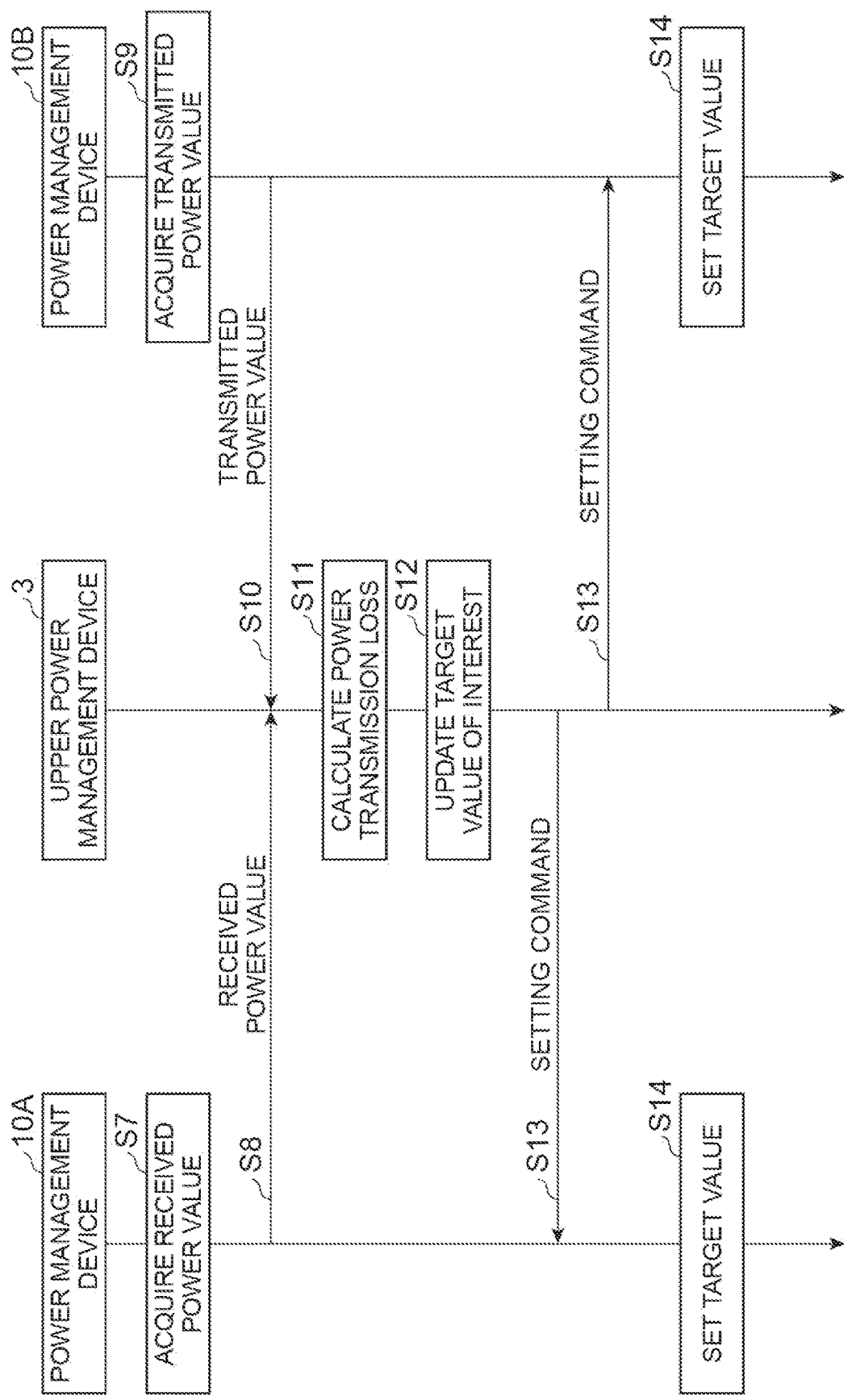
FIG. 6 is a sequence diagram showing a series of operations of the power interchange system shown in FIG. 1.

Next, a series of operations of the power interchange system 1 will be described with reference to FIGS. 5 and 6. FIGS. 5 and 6 are sequence diagrams showing an example of a series of operations of the power interchange system shown in FIG. 1. Here, a case in which the power feeding system 2A (first power feeding system) runs short of the amount of stored electric power will be described as an example.

As shown in FIGS. 5 and 6, first, the power management device of the power feeding system 2A (hereinafter referred to as "power management device 10A" in some cases) transmits the power transmission request to the upper power management device 3 (step S1). Upon receiving the power transmission request, the upper power management device 3 transmits the power transmission request to the power feeding system 2B (second power feeding system) (step S2). Then, upon receiving the power transmission request, the power management device 10 of the power feeding system 2B (hereinafter referred to as "power management device 10B" in some cases) checks the amount of electric power stored in the power feeding system 2B (step S3).

Specifically, when the amount of electric power stored in the power feeding system 2B exceeds the storage threshold value Bth2, the power management device 10B transmits the power transmission enabled response to the upper power management device 3, and when the amount of electric power stored in the power feeding system 2B is equal to or less than the storage threshold value Bth2, the power management device 10B transmits the power transmission disabled response to the upper power management device 3. Here, it is assumed that the amount of electric power stored in the power feeding system 2B exceeds the storage threshold value Bth2. Therefore, the power management device 10B transmits the power transmission enabled response to the upper power management device 3 (step S4).

Subsequently, upon receiving the power transmission enabled response, the upper power management device 3 transmits a setting command for setting an initial value (for example, 350 V) of the power reception target value to the power feeding system 2A, and transmits a setting command for setting an initial value (for example, 400 V) of the power transmission target value to the power feeding system 2B (step S5). Upon receiving the setting command, the power management device 10A transmits the setting command to the bidirectional DC/DC converter 9 (first converter) in the power feeding system 2A, and sets the target value of the external bus voltage Vbus1 in the bidirectional DC/DC converter 9 to the initial value of the power reception target value (step S6). Similarly, upon receiving the setting command, the power management device 10B transmits the setting command to the bidirectional DC/DC converter 9 (second converter) in the power feeding system 2B, and sets the target value of the external bus voltage Vbus1 in the bidirectional DC/DC converter 9 to the initial value of the power transmission target value (step S6). As a result, power transmission from the power feeding system 2B to the power feeding system 2A is started.

Subsequently, the bidirectional DC/DC converter 9 in the power feeding system 2A measures the received power and transmits the measured value (received power value) to the power management device 10A. Then, the power management device 10A acquires the received power value from the bidirectional DC/DC converter 9 of the power feeding system 2A (step S7), and transmits the received power value to the upper power management device 3 (step S8). Similarly, the bidirectional DC/DC converter 9 in the power feeding system 2B measures the transmitted power and transmits the measured value (transmitted power value) to the power management device 10B. Then, the power management device 10B acquires the transmitted power value from the bidirectional DC/DC converter 9 of the power feeding system 2B (step S9), and transmits the transmitted power value to the upper power management device 3 (step S10).

Subsequently, upon receiving the transmitted power value and the received power value, the upper power management device 3 calculates the power transmission loss (step S11). The upper power management device 3 subtracts the received power value from the transmitted power value, for example, and calculates the subtraction result as the power transmission loss. Then, the upper power management device 3 updates the target value of interest based on the power transmission loss (step S12). Here, the power transmission target value and the power reception target value are updated as the target value of interest. A method of updating the target value will be described later. Then, the upper power management device 3 transmits a setting command (first setting command) for setting the updated power reception target value to the power feeding system 2A, and transmits a setting command (second setting command) for setting the updated power transmission target value to the power feeding system 2B (step S13).

Upon receiving the setting command, the power management device 10A transmits the setting command to the bidirectional DC/DC converter 9 in the power feeding system 2A, and sets the target value of the external bus voltage Vbus1 in the bidirectional DC/DC converter 9 to the updated power reception target value (step S14). Similarly, upon receiving the setting command, the power management device 10B transmits the setting command to the bidirectional DC/DC converter 9 in the power feeding system 2B, and sets the target value of the external bus voltage Vbus1 in the bidirectional DC/DC converter 9 to the updated power transmission target value (step S14). Thereafter, steps S7 to S14 are repeated until the upper power management device 3 receives the stop request.

When the power interchange system 1 includes three or more power feeding systems, the power interchange system 1 operates similarly to the series of operations shown in FIGS. 5 and 6. In this case, in step S2, the upper power management device 3 transmits the power transmission request to all power feeding systems other than the power feeding system which has transmitted the power transmission request (which is making the power transmission request) among the power feeding systems included in the power interchange system 1. Then, in step S5, when the upper power management device 3 receives the power transmission enabled response from the plurality of power feeding systems, the upper power management device 3 transmits a setting command for setting an initial value of the power transmission target value to all the power feeding systems that have transmitted the power transmission enabled response. Thus, a configuration is realized in which a plurality of power feeding systems transmit electric power to one power feeding system. Each time the upper power management device 3 receives a power transmission request from a power feeding system, it repeats the processes from step S2 and subsequent steps, thereby realizing a configuration in which one or more power feeding systems transmit electric power to a plurality of power feeding systems.

In step S11, the upper power management device 3 calculates the power transmission loss by subtracting the sum of the received power values from the sum of the transmitted power values. Then, in step S12, the upper power management device 3 updates the target value of interest based on the power transmission loss. Therefore, in a configuration in which one or more power feeding systems transmit electric power to one or more power feeding systems, the target value of interest can be updated.

Figure 7:
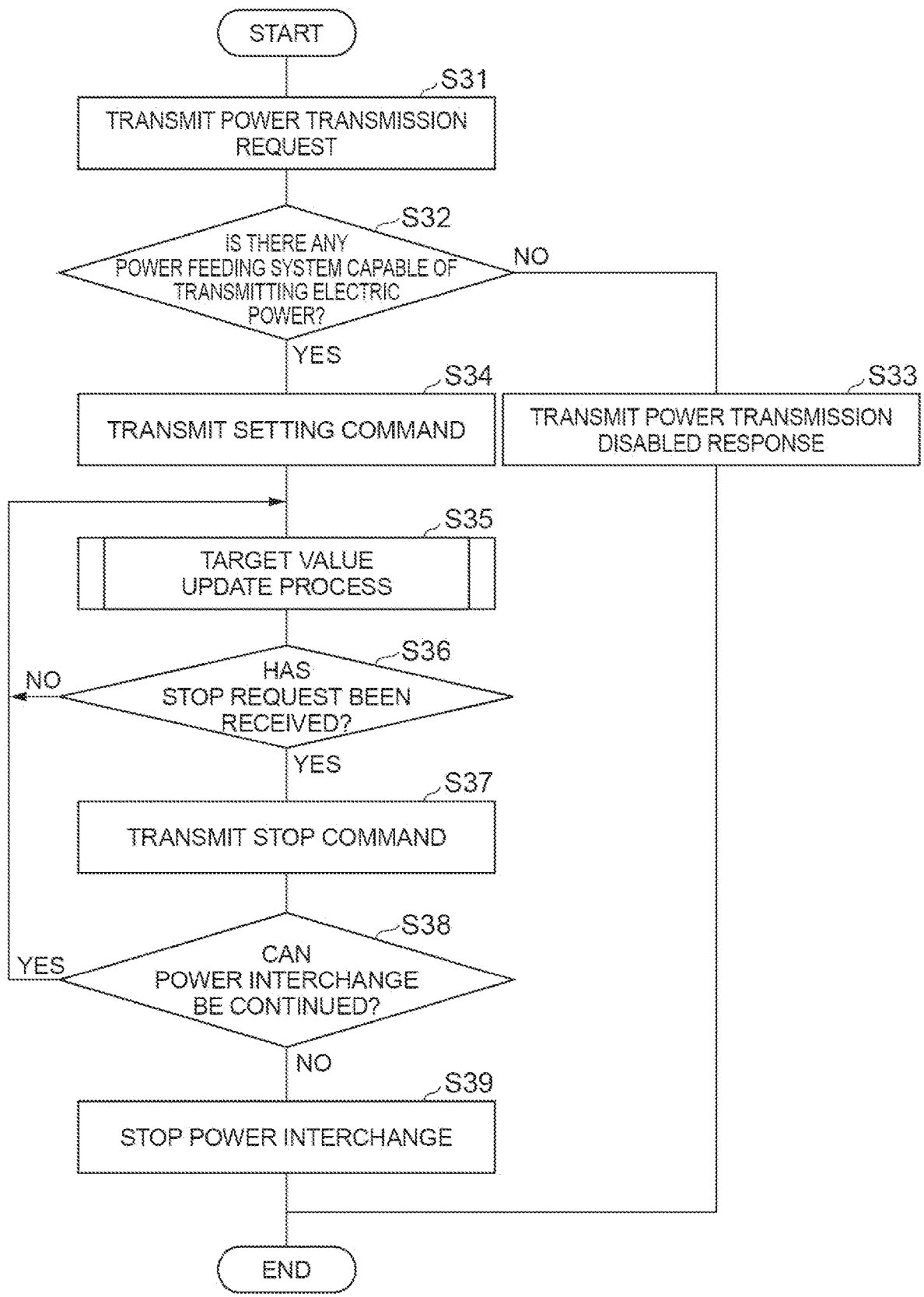
FIG. 7 is a flowchart showing a series of processes of a power interchange control method performed by the upper power management device shown in FIG. 1.
Figure 8:
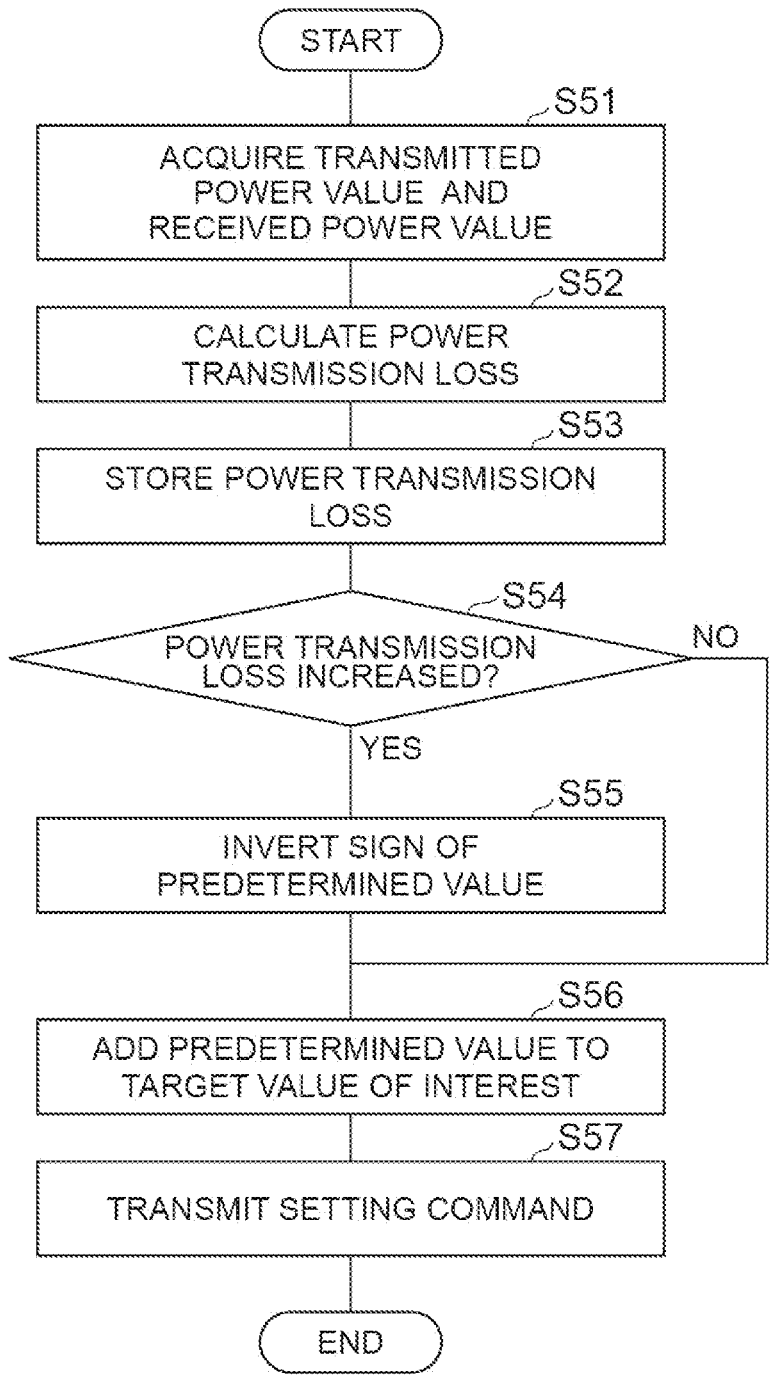
FIG. 8 is a flowchart showing the target value update process shown in FIG. 7 in detail.

Next, a series of processes of the power interchange control method performed by the upper power management device 3 will be generally described with reference to FIGS. 7 and 8. FIG. 7 is a flowchart showing a series of processes of the power interchange control method performed by the upper power management device shown in FIG. 1. FIG. 8 is a flowchart showing the target value update process shown in FIG. 7 in detail. The series of processes shown in FIG. 7 is started when the upper power management device 3 receives a power transmission request.

As shown in FIG. 7, first, the response unit 31 transmits a power transmission request to the power feeding system (step S31). For example, the response unit 31 transmits the power transmission request to all power feeding systems other than the power feeding system which has transmitted the power transmission request (which is making the power transmission request) among the power feeding systems included in the power interchange system 1. The response unit 31 receives the power transmission enabled response or the power transmission disabled response as a response to the power transmission request from (the power management device 10 of) each power feeding system.

Subsequently, the response unit 31 determines whether or not there is any power feeding system capable of transmitting electric power in the power interchange system 1 (step S32). For example, when the response unit 31 receives the power transmission enabled response from at least one power feeding system, the response unit 31 determines that there is a power feeding system that can transmit electric power in the power interchange system 1. When the response unit 31 receives the power transmission disabled responses from all the power feeding systems, the response unit 31 determines that there is no power feeding system capable of transmitting electric power in the power interchange system 1. When it is determined in step S32 that there is no power feeding system capable of transmitting electric power in the power interchange system 1 (step S32: NO), the response unit 31 transmits the power transmission disabled response to the power feeding system making the power transmission request (step S33), and the series of processes shown in FIG. 7 ends.

On the other hand, when it is determined in step S32 that there is a power feeding system capable of transmitting electric power in the power interchange system 1 (step S32: YES), the response unit 31 transmits a setting command for setting an initial value of the power reception target value to the power feeding system making the power transmission request, and transmits a setting command for setting an initial value of the power transmission target value to all power feeding systems capable of transmitting electric power (step S34). The initial value of the power transmission target value and the initial value of the power reception target value are set in advance and stored in a memory (not shown).

When (the power management device 10 of) each power feeding system receives the setting command, the target value of the external bus voltage Vbus1 in the bidirectional DC/DC converter 9 of the power feeding system making the power transmission request is set to the initial value of the power reception target value, and the target value of the external bus voltage Vbus1 in the bidirectional DC/DC converter 9 of the power feeding system capable of transmitting electric power is set to the initial value of the power transmission target value. As a result, power transmission from the power feeding system capable of transmitting electric power to the power feeding system which is making the power transmission request is started. That is, power interchange is started between the power feeding systems.

Subsequently, the upper power management device 3 performs target value update process (step S35). In the target value update process in step S35, as shown in FIG. 8, first, the acquisition unit 32 acquires the transmitted power value and the received power value (step S51). Specifically, the acquisition unit 32 receives the transmitted power value from (the power management device 10 of) the power feeding system transmitting electric power, and receives the received power value from (the power management device 10 of) the power feeding system receiving electric power. Then, the acquisition unit 32 outputs the transmitted power value and the received power value to the update unit 33.

Subsequently, the update unit 33 calculates the power transmission loss (step S52). In step S52, upon receiving the transmitted power value and the received power value, the update unit 33 calculates the power transmission loss based on the transmitted power value and the received power value. More specifically, the update unit 33 subtracts the sum of the received power values from the sum of the transmitted power values, and calculates the subtraction result as the power transmission loss. Then, the update unit 33 stores (information indicating) the power transmission loss in a memory (not shown) (step S53).

Subsequently, the update unit 33 determines whether or not the power transmission loss has increased (step S54). In step S54, the update unit 33 compares the power transmission loss calculated in step S52 (current power transmission loss) with the previous power transmission loss stored in the memory, and determines whether the power transmission loss has increased. When the current power transmission loss is larger than the previous power transmission loss, the update unit 33 determines that the power transmission loss has increased (step S54: YES) and inverts a sign of a predetermined value (step S55). The predetermined value is a value defining an increase/decrease amount (variation amount) of the target value of interest in one target value update process. That is, the target value of interest is increased or decreased by the predetermined value in one target value update process. From the viewpoint of control voltage accuracy, the predetermined value may be 1 V or more. The predetermined value is set to, for example, about 1 V to 10 V. Here, the predetermined value is set to about 2 V. As the amount of change in the power transmission loss due to increase or decrease by the predetermined value decreases, the predetermined value may be gradually decreased.

The target value of interest includes at least one of the power transmission target value and the power reception target value. When the target value of interest includes both the power transmission target value and the power reception target value, that is, when both the power transmission target value and the power reception target value are updated, a predetermined value for the power transmission target value may be different from or the same as a predetermined value for the power reception target value. In this case, the sign of the predetermined value for the power transmission target value is the same as the sign of the predetermined value for the power reception target value.

On the other hand, in step S54, when the current power transmission loss is equal to or less than the previous power transmission loss, the update unit 33 determines that the power transmission loss has not increased (step S54: NO) and maintains the sign of the predetermined value.

Subsequently, the update unit 33 adds the predetermined value to the target value of interest (step S56). Here, when it is determined in step S54 that the power transmission loss has not increased, since the sign of the predetermined value is maintained, whether the target value of interest is increased or decreased is the same as in the previous target value update process. That is, when the target value of interest is decreased in the previous target value update process, the target value of interest is also decreased in the current target value update process. On the other hand, when it is determined in step S54 that the power transmission loss has increased, since the sign of the predetermined value is inverted, whether the target value of interest is increased or decreased is different from the previous target value update process. That is, when the target value of interest is decreased in the previous target value update process, the target value of interest is increased in the current target value update process. Then, the update unit 33 outputs the updated target value of interest to the output unit 34.

Subsequently, the output unit 34 transmits a setting command (step S57). In step S57, upon receiving the updated target value of interest, the output unit 34 generates a setting command for setting the updated target value of interest. Then, the output unit 34 transmits the setting command to the power feeding system including the bidirectional DC/DC converter 9 which sets the target value of interest. For example, when the target value of interest includes both the power transmission target value and the power reception target value, the output unit 34 transmits a setting command for setting the updated power reception target value to the power feeding system receiving electric power, and transmits a setting command for setting the updated power transmission target value to the power feeding system transmitting electric power. When each power feeding system receives the setting command, the target value of the external bus voltage Vbus1 in the bidirectional DC/DC converter 9 is set to the updated target value of interest.

Thus, the target value update process in step S35 is completed.

Subsequently, the response unit 31 determines whether or not the response unit 31 has received a stop request from any power feeding system participating in power interchange (step S36). When the response unit 31 has not received a stop request from any power feeding system participating in power interchange (step S36: NO), step S35 is performed again. On the other hand, when the response unit 31 receives a stop request from any power feeding system participating in power interchange (step S36: YES), the response unit 31 transmits a stop command for stopping power interchange to the power feeding system which has transmitted the stop request (step S37). Upon receiving the stop command, the power feeding system which has transmitted the stop request stops the bidirectional DC/DC converter 9.

Subsequently, the response unit 31 determines whether or not power interchange can be continued (step S38). For example, when there are both a power feeding system performing power transmission and a power feeding system performing power reception, the response unit 31 determines that power interchange can be continued. When at least one of the power feeding system performing power transmission and the power feeding system performing power reception does not exist, the response unit 31 determines that power interchange cannot be continued. When it is determined in step S38 that power interchange can be continued (step S38: YES), step S35 is performed again. On the other hand, when it is determined in step S38 that power interchange cannot be continued (step S38: NO), the response unit 31 outputs a stop command to all the power feeding systems participating in power interchange and stops power interchange (step S39).

Thus, the series of processes shown in FIG. 7 is completed.

Figure 9:
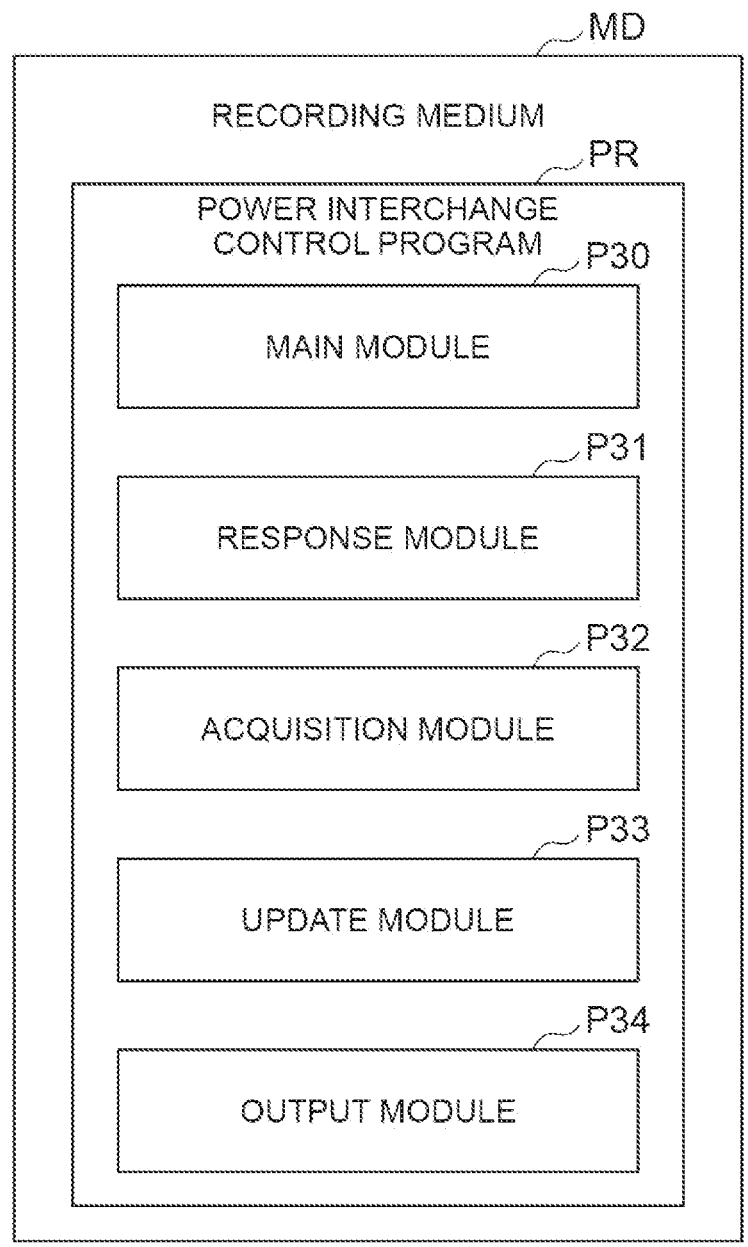
FIG. 9 is a diagram showing a configuration of a power interchange control program recorded in a recording medium.

Next, a power interchange control program PR for causing the computer 100 to function as the upper power management device 3 and a recording medium MID in which the power interchange control program PR is recorded will be described with reference to FIG. 9. FIG. 9 is a diagram showing a configuration of a power interchange control program recorded in a recording medium.

As shown in FIG. 9, the power interchange control program PR includes a main module P30, a response module P31, an acquisition module P32, an update module P33, and an output module P34. The main module P30 is a section that integrally controls processes relating to the upper power management device 3. The functions realized by executing the response module P31, the acquisition module P32, the update module P33, and the output module P34 are the same as the functions of the response unit 31, the acquisition unit 32, the update unit 33, and the output unit 34 in the above-described embodiment, respectively.

The power interchange control program PR is recorded in the recording medium MD. The recording medium MD is a non-transitory computer-readable recording medium. Examples of the recording medium MD include a compact disc read only memory (CD-ROM), a digital versatile disc read only memory (DVD-ROM), and a semiconductor memory. The power interchange control program PR may be provided as data signals via the communication network NW.

In the upper power management device 3, the power interchange control method, and the recording medium MD described above, the target value of interest is updated based on the received power value received by the power feeding system making the power transmission request and the transmitted power value transmitted by the power feeding system responding to the power transmission request. For example, when power transmission (power interchange) is performed from one power feeding system to another power feeding system via the external DC bus B1, the power transmission target value of the external bus voltage Vbus1 in the bidirectional DC/DC converter 9 of the one power feeding system and the power reception target value of the external bus voltage Vbus1 in the bidirectional DC/DC converter 9 of the another power feeding system may affect the power transmission efficiency. Since it can be said that the power transmission loss increases as the received power value becomes smaller than the transmitted power value, the target value of interest can be updated so as to suppress the power transmission loss by considering the received power value and the transmitted power value. As a result, the power transmission efficiency can be improved.

Specifically, the update unit 33 calculates the power transmission loss based on the received power value and the transmitted power value, and updates the target value of interest so as to reduce the power transmission loss. According to this configuration, the power transmission loss is reduced, so that the power transmission efficiency can be improved.

More specifically, the update unit 33 repeatedly updates the target value of interest. When the power transmission loss decreases compared to the power transmission loss in the previous target value update process, the update unit 33 updates the target value of interest by adding the predetermined value to the target value of interest while maintaining the sign of the predetermined value. When the power transmission loss increases compared to the power transmission loss in the previous target value update process, the update unit 33 inverts the sign of the predetermined value and adds the predetermined value having the inverted sign to the target value of interest to update the target value of interest. According to this configuration, as long as the power transmission loss continues to decrease, the target value of interest is changed by the predetermined value in the same direction as in the previous target value update process. For example, when the target value of interest is reduced in the previous target value update process, the target value of interest is also reduced in the current target value update process. On the other hand, when the power transmission loss turns to increase, the target value of interest is changed by the predetermined value in the direction opposite to the previous update. When the target value of interest is reduced in the previous target value update process, the target value of interest is increased in the current target value update process. Therefore, it is possible to search for an extreme value of the target value of interest in which the power transmission loss is minimum within the range of change of the target value of interest.

The response unit 31 selects, among the plurality of power feeding systems, a power feeding system that has transmitted the power transmission enabled response as a power feeding system capable of transmitting electric power. In the power feeding system that has transmitted the power transmission enabled response, the amount of stored electric power is excessive and the power feeding system can supply electric power to other power feeding systems. The power feeding system transmits electric power to the power feeding system that is making the power transmission request, thereby the possibility that electric power shortage occurs in the power interchange system 1 as a whole can be reduced.

The upper power management device, the power interchange control method, and the recording medium according to the present disclosure are not limited to the above-described embodiments.

At least one of the power conditioner 52, the AC/DC converter 62, the converter 7, the bidirectional DC/DC converter 83, and the bidirectional DC/DC converter 9 may not have the power measurement function. In this case, the power management device 10 may acquire the measured value of each electric power from the measured value of the voltage measured by the voltage sensor and the measured value of the electric current measured by the current sensor.

The power supply device 5 may include another power generation device in place of the renewable energy power generation device 51.

The auxiliary power supply device 6 may include a power generation device in place of the commercial power supply 61. An example of the power generation device is a diesel generator. In this case, the number of the auxiliary power supply devices 6 is not limited to one, and may be appropriately changed as necessary. When the auxiliary power supply device 6 does not include the commercial power supply 61, the power feeding systems 2A and 2B are also referred to as independent DC power feeding systems. The auxiliary power supply device 6 may be used only when the power feeding systems 2A and 2B are started up. For example, when an electric power shortage occurs in the power feeding system 2A, the power feeding system 2A may first receive electric power from the power feeding system 2B, and then may receive electric power from the auxiliary power supply device 6 when electric power cannot be received from the power feeding system 2B.

In the above-described embodiment, each of the power conditioner 52, the AC/DC converter 62, the converters 7, the bidirectional DC/DC converters 83, and the bidirectional DC/DC converter 9 operates with a DC voltage generated inside the device. Alternatively, each of the power feeding systems 2A and 2B may include a power supply unit, which generates a DC voltage having a constant voltage value from the internal bus voltage Vbus2 of the internal DC bus B2, and supplies the DC voltage (electric power) to each device.

The power feeding system 2A may not include the renewable energy power generation device 51. In this case, the renewable energy power generation device 51 provided outside the power feeding system 2A may be connected to the internal DC bus B2 via the power conditioner 52 included in the power feeding system 2A.

The power feeding system 2A may not include the commercial power supply 61. In this case, the commercial power supply 61 provided outside the power feeding system 2A may be connected to the internal DC bus B2 via the AC/DC converter 62 included in the power feeding system 2A.

As described above, in the target value update process, both the power transmission target value and the power reception target value may be updated, and only one of them may be updated. For example, the power reception target value may be set to a predetermined fixed value, and only the power transmission target value may be updated. Alternatively, the power transmission target value may be set to a predetermined fixed value, and only the power reception target value may be updated.

The target value of interest may be updated by a method different from the above-described embodiments. For example, a plurality of combinations of the power transmission target value and the power reception target value may be prepared in advance and a combination with the minimum power transmission loss may be searched for by sequentially using these combinations.

What is claimed is:

1. An upper power management device that controls power interchange between a plurality of power feeding systems connected to each other via an external direct current (DC) bus, the upper power management device comprising:
   an acquisition unit configured to acquire a received power value that is a measured value of electric power received by a first power feeding system, and a transmitted power value that is a measured value of electric power transmitted by a second power feeding system, the first power feeding system being a power feeding system that is making a power transmission request among the plurality of power feeding systems, the second power feeding system being a power feeding system that is responding to the power transmission request among the plurality of power feeding systems;
   an update unit configured to update a target value of interest based on the received power value and the transmitted power value, the target value of interest including at least one of a power reception target value that is a target value of an external bus voltage supplied to the external DC bus in a first converter and a power transmission target value that is a target value of the external bus voltage in a second converter, the first converter being capable of bidirectionally converting between the external bus voltage and a first internal bus voltage supplied to a first internal DC bus that supplies DC electric power in the first power feeding system, the second converter being capable of bidirectionally converting between the external bus voltage and a second internal bus voltage supplied to a second internal DC bus that supplies DC electric power in the second power feeding system; and
   an output unit configured to output a first setting command for setting the power reception target value in the first converter and a second setting command for setting the power transmission target value in the second converter.

2. The upper power management device according to claim 1,
   wherein the update unit calculates a power transmission loss based on the received power value and the transmitted power value, and updates the target value of interest so as to reduce the power transmission loss.

3. The upper power management device according to claim 2,
   wherein the update unit repeatedly updates the target value of interest, and
   wherein the update unit updates the target value of interest by adding a predetermined value to the target value of interest while maintaining a sign of the predetermined value when the power transmission loss decreases compared to the power transmission loss in a previous update, and updates the target value of interest by inverting the sign of the predetermined value and adding the predetermined value having the inverted sign to the target value of interest when the power transmission loss increases compared to the power transmission loss in the previous update.

4. The upper power management device according to claim 1, further comprising:
   a response unit configured to respond to the power transmission request,
   wherein the response unit selects, as the second power feeding system, a power feeding system that has transmitted a power transmission enabled response from among the plurality of power feeding systems.

5. A power interchange control method for controlling power interchange between a plurality of power feeding systems connected to each other via an external DC bus, the power interchange control method comprising:
- acquiring a received power value that is a measured value of electric power received by a first power feeding system, and a transmitted power value that is a measured value of electric power transmitted by a second power feeding system, the first power feeding system being a power feeding system that is making a power transmission request among the plurality of power feeding systems, the second power feeding system being a power feeding system that is responding to the power transmission request among the plurality of power feeding systems;
- updating a target value of interest based on the received power value and the transmitted power value, the target value of interest including at least one of a power reception target value that is a target value of an external bus voltage supplied to the external DC bus in a first converter and a power transmission target value that is a target value of the external bus voltage in a second converter, the first converter being capable of bidirectionally converting between the external bus voltage and a first internal bus voltage supplied to a first internal DC bus that supplies DC electric power in the first power feeding system, the second converter being capable of bidirectionally converting between the external bus voltage and a second internal bus voltage supplied to a second internal DC bus that supplies DC electric power in the second power feeding system; and
- outputting a first setting command for setting the power reception target value in the first converter and a second setting command for setting the power transmission target value in the second converter.

6. A non-transitory computer-readable recording medium recording a power interchange control program that causes a computer to operate so as to control power interchange between a plurality of power feeding systems connected to each other via an external DC bus, the power interchange control program configured to cause a computer to execute:
- acquiring a received power value that is a measured value of electric power received by a first power feeding system, and a transmitted power value that is a measured value of electric power transmitted by a second power feeding system, the first power feeding system being a power feeding system that is making a power transmission request among the plurality of power feeding systems, the second power feeding system being a power feeding system that is responding to the power transmission request among the plurality of power feeding systems;
- updating a target value of interest based on the received power value and the transmitted power value, the target value of interest including at least one of a power reception target value that is a target value of an external bus voltage supplied to the external DC bus in a first converter and a power transmission target value that is a target value of the external bus voltage in a second converter, the first converter being capable of bidirectionally converting between the external bus voltage and a first internal bus voltage supplied to a first internal DC bus that supplies DC electric power in the first power feeding system, the second converter being capable of bidirectionally converting between the external bus voltage and a second internal bus voltage supplied to a second internal DC bus that supplies DC electric power in the second power feeding system; and
- outputting a first setting command for setting the power reception target value in the first converter and a second setting command for setting the power transmission target value in the second converter.

* * * * *